US008501395B2

(12) United States Patent
Dai et al.

(10) Patent No.: US 8,501,395 B2
(45) Date of Patent: Aug. 6, 2013

(54) LINE EDGE ROUGHNESS REDUCTION AND DOUBLE PATTERNING

(75) Inventors: Huixiong Dai, San Jose, CA (US);
Xumou Xu, Campbell, CA (US);
Christopher S. Ngai, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 671 days.

(21) Appl. No.: 12/156,770

(22) Filed: Jun. 3, 2008

(65) Prior Publication Data
US 2009/0142926 A1 Jun. 4, 2009

Related U.S. Application Data

(60) Provisional application No. 60/933,270, filed on Jun. 4, 2007.

(51) Int. Cl.
*G03F 7/20* (2006.01)
(52) U.S. Cl.
USPC .......................................................... 430/323
(58) Field of Classification Search
USPC .......................... 430/311, 313, 394, 322, 323
See application file for complete search history.

(56) References Cited

U.S. PATENT DOCUMENTS

| 6,566,040 | B1 * | 5/2003 | Sugino et al. ................. 430/313 |
| 2002/0187627 | A1 * | 12/2002 | Yuang ........................... 438/622 |
| 2003/0008490 | A1 * | 1/2003 | Xing et al. .................... 438/622 |
| 2005/0175937 | A1 * | 8/2005 | Bae .............................. 430/312 |
| 2006/0010684 | A1 * | 1/2006 | Lee et al. ................... 29/603.15 |
| 2006/0132748 | A1 * | 6/2006 | Fukuhara ........................ 355/67 |
| 2007/0048670 | A1 * | 3/2007 | Choi et al. .................... 430/311 |
| 2007/0197014 | A1 * | 8/2007 | Jeon et al. ..................... 438/597 |
| 2007/0242254 | A1 * | 10/2007 | Nagasaka ....................... 355/67 |
| 2008/0044770 | A1 * | 2/2008 | Nozaki et al. ................. 430/311 |

* cited by examiner

*Primary Examiner* — Brittany Raymond
(74) *Attorney, Agent, or Firm* — Blakely, Sokoloff, Taylor & Zafman LLP

(57) ABSTRACT

Embodiments of the present invention relate to lithographic processes used in integrated circuit fabrication for improving line edge roughness (LER) and reduced critical dimensions (CD) for lines and/or trenches. Embodiments use the combinations of polarized light lithography, shrink coating processes, and double exposure processes to produce synergetic effects in the formation of trench structures having good resolution, reduced CDs, reduced pitch, and reduced LER in the lines and/or trenches of the patterned interconnect structures.

20 Claims, 4 Drawing Sheets

LINE EDGE ROUGHNESS REDUCTION AND DOUBLE PATTERNING This application claims the benefit of U.S. Provisional Application No. 60/933,270, filed Jun. 4, 2007, the entire contents of which are hereby incorporated by reference herein.

BACKGROUND OF THE INVENTION

1. Field of the Invention

The present invention relates to the field of integrated circuit fabrication. Particularly in lithographic processes for improving line edge roughness (LER) and reduced critical dimensions (CD) for lines and trenches.

2. Discussion of Related Art

The semiconductor industry is continually pursuing smaller and smaller geometries of the structures used in semiconductor devices. As the device geometries become smaller, more devices are fabricated into the same area of semiconductor substrate. Therefore, the number of interconnect lines in the same area of substrate must also increase, thus requiring that the sizes of the interconnect lines and the spacing between the interconnect lines also decrease in size. This results in the need to reduce both the geometries, i.e. the critical dimensions (CD), of the interconnect lines and the pitch between interconnect lines. Furthermore, as lithographic processes are pushed to the limit, interconnect lines suffer from line edge roughness (LER). Interconnect lines having a high LER may result in degraded performance of the device, possibly due to larger line resistances, increased intra-line capacitances and cross-talk, and may even result in short and/or open circuits.

Accordingly, there exists a need for an improved lithographic process that can reduce CDs, provide tighter pitches between interconnect lines, and reduce LER.

SUMMARY OF THE INVENTION

Embodiments may provide a method of patterning a semiconductor structure comprising: providing a substrate having a photoresist layer; exposing the photoresist layer with a pattern of polarized light; performing a post-exposure bake on the exposed photoresist layer; developing the photoresist layer to form a pattern photoresist layer; applying a shrink coating over the patterned photoresist; baking the shrink coating; and rinsing the shrink coating from the patterned photoresist. In embodiments the semiconductor structure may comprises a plurality of lines and/or trenches, having an orientation, and wherein the pattern of polarized light further comprises predominately transverse magnetic (TM) fields, which are approximately parallel to the orientation of the plurality of lines and/or trenches; and attenuated transverse electric (TE) fields, which are approximately perpendicular to the orientation of the plurality of lines and/or trenches.

Embodiments may provide a double exposure lithographic method comprising: depositing a first layer of photoresist over a hard mask layer over a bottom layer on a substrate; exposing the first photoresist layer with a first pattern; performing a first post-exposure bake and first develop of the exposed first photoresist layer to form a first patterned photoresist layer; applying a first shrink coating over the first patterned photoresist; baking the first shrink coating and first patterned photoresist, wherein the first shrink coating contracts, pulling the photoresist into the trenches of the first patterned photoresist, thus reducing the sizes of the trenches patterned in the first patterned photoresist; rinsing the first shrink coating from the first patterned photoresist; performing a first post develop bake of the first patterned layer of photoresist; transferring the first pattern into the hard mask layer, to form a first patterned hard mask layer; removing the first patterned photoresist; depositing a second layer of photoresist over the first patterned hard mask layer; exposing the second photoresist layer with a second pattern; performing a second post-exposure bake of the second photoresist layer; developing the exposed second photoresist layer to form a second patterned photoresist layer; applying a second shrink coating over the second patterned photoresist layer, baking the second shrink coating and second patterned photoresist, so that the second shrink coating may contract, pulling the photoresist into the trenches of the second patterned photoresist, thus reducing the sizes of the trenches in the second patterned photoresist layer; rinsing the second shrink coating from the second patterned photoresist layer; performing a second post develop bake of the second patterned photoresist layer; transferring the second pattern into the first patterned hard mask layer to form a fully patterned hard mask layer, wherein the fully patterned hard mask layer comprises a combination of the first and second patterns, each have alternating structures, with relaxed pitches, which are different and offset from each other, so that the combination of the first and second patterns results in a fully patterned structure, with tight pitches; removing the second patterned photoresist layer; and transferring the fully patterned structure in the fully patterned hard mask layer to the bottom layer underlying the fully patterned hard mask layer.

In embodiments, the method may further comprise a first bottom anti-reflective coating (BARC) over the hard mask layer and underlying the first photoresist layer. In embodiments, the method may further comprise depositing a second bottom anti-reflective coating (BARC) over the first patterned hard mask layer and prior to depositing the second photoresist layer. In embodiments, the fully patterned structure comprises a plurality of lines and/or trenches, having an orientation, and wherein the exposing of the first and second photoresist layers with the first and second patterns, each having a plurality of lines and/or trenches, comprises exposing with polarized light, which comprises predominately transverse magnetic (TM) fields, which are approximately parallel to the orientation of the plurality of lines and/or trenches; and attenuated transverse electric (TE) fields, which are approximately perpendicular to the orientation of the plurality of lines and/or trenches. In embodiments, the first and second shrink coatings may comprise a material that when baked at a bake temperature, contracts pulling the walls of the first and second patterned photoresist layers into trenches formed in the first and second patterned photoresist layers, so as to narrow the trenches.

BRIEF DESCRIPTION OF THE DRAWINGS

The invention is described by way of example with reference to the accompanying drawings, wherein.

DETAILED DESCRIPTION OF THE PRESENT INVENTION

In the following description, various aspects of the present invention will be described, and various details set forth in order to provide a thorough understanding of the present invention. However, it would be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1 through 4B are merely illustrative and may not be drawn to scale. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some embodiments anticipate the application of the invention in any lithographic process for forming structures requiring small CDs and reduced LER. Some embodiments anticipate applying the invention for the formation of interconnect structures, such as those used in integrated circuits. Some embodiments further anticipate applying the invention for interconnect structures that comprise a plurality of interconnect trenches. Some embodiments further anticipate applying the invention for interconnect trenches comprising a plurality of parallel interconnect trenches.

Figure 1:
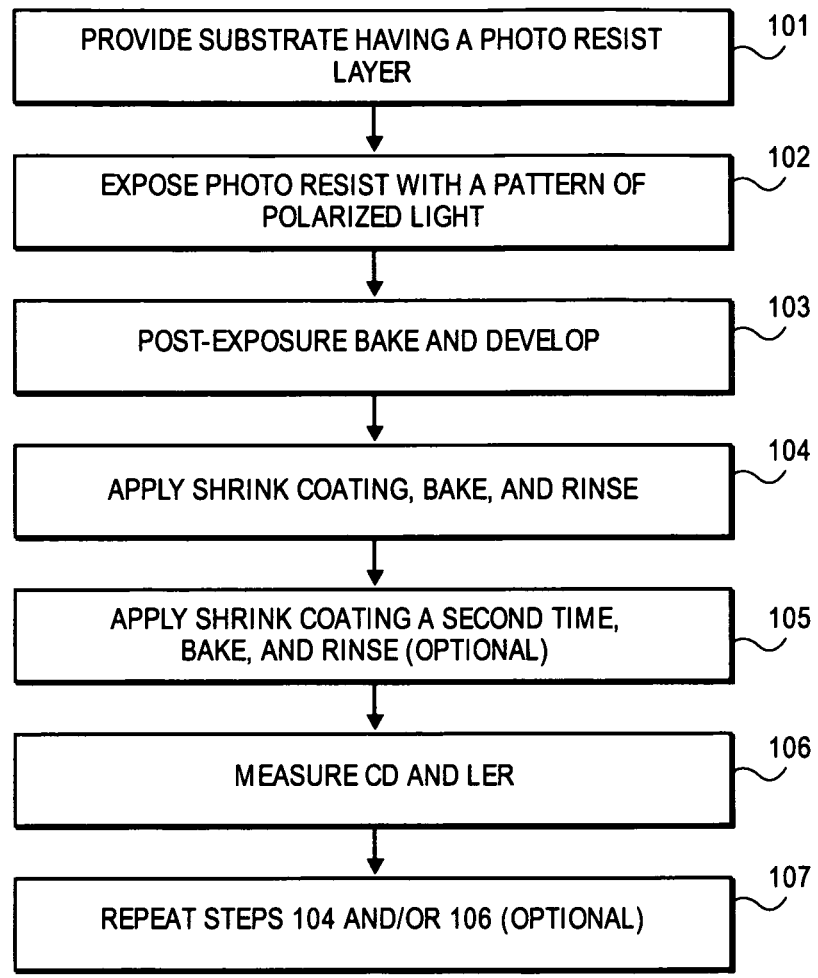
FIG. 1 illustrates embodiments of a lithographic process for line edge roughness (LER) reduction and for further reducing the critical dimension (CD) capabilities of lithographic processes.

Embodiments, illustrated in FIG. 1, relate to a lithographic process for reducing line edge roughness (LER), improving resolution, and reducing critical dimension (CD) capabilities of lithographic processes. Embodiments of the process may comprise providing a substrate having a photoresist layer, as set forth in block 101; exposing the photoresist layer with a pattern of polarized light, as set forth in block 102; performing a post-exposure bake on the exposed photoresist layer and developing the photoresist layer to form a pattern photoresist layer, as set forth in block 103; and applying a shrink coating over the patterned photoresist, baking the shrink coating, and rinsing the shrink coating from the patterned photoresist, as set forth in block 104. In embodiments, the process may further comprises measuring the CD and/or the LER, as set forth in block 106. In embodiments, the process may further comprise using the results of the CD and/or the LER measurements to determine whether to perform another application of shrink coating, baking, and rinsing, as set forth in block 107. In embodiments, the process may comprise including a second application of the shrink coating, baking, and rinsing, as set forth in block 105, before performing a CD or LER measurement, as set forth in block 106.

Embodiments using the combination of polarized light lithography and shrink coating processes may produce synergetic effects in the formation of trench structures, particularly in integrated circuit fabrication. Polarized light lithography provides good resolution, but is not very effective in reducing LER. Shrink coating processes are effective in reducing CDs in trenches and reducing LER, but are not useful in improving resolution. The combination of polarized lithography and shrink coating processes provides better than expected resolution, LER, and reduced CDs.

Figure 2:
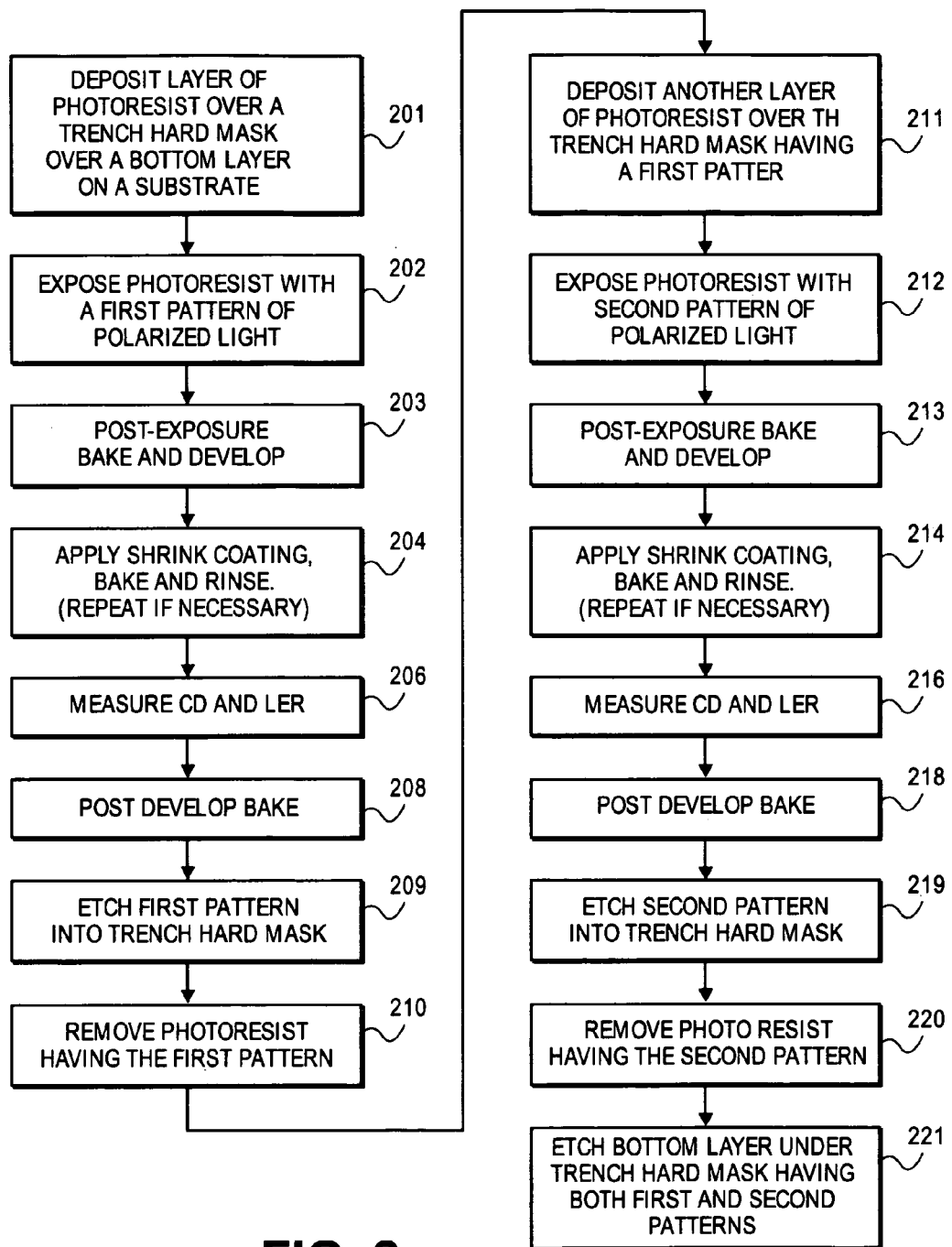
FIG. 2 illustrates embodiments of a double exposure lithographic process for reducing line edge roughness (LER), increasing resolution, reducing the critical dimension (CD) and pitch capabilities of lithographic processes.

Embodiments, illustrated in FIG. 2, relate to embodiments of a double exposure lithographic process for reducing line edge roughness (LER), increasing resolution, reducing the critical dimension (CD) and pitch capabilities of lithographic processes. Embodiments of the process may comprise depositing a layer of photoresist over a trench hard mask layer over a bottom layer on a substrate, as set forth in block 201; exposing the photoresist layer with a first pattern of polarized light, as set forth in block 202; performing a post-exposure bake and develop of the exposed photoresist, as set forth in block 203, thus forming a first pattern in the photoresist layer; applying a shrink coating over the patterned photoresist, baking the shrink coating and photoresist, as set forth in block 204, so that the shrink coating may contract, pulling the photoresist into the trenches of the patterned photoresist, thus reducing the sizes of the trenches patterned in the photoresist, and rinsing the shrink coating from the patterned photoresist; measuring the CD and/or LER of the trenches formed in the photoresist, as set forth in block 206; repeating the application of the shrink coating, if necessary, as set forth in block 204; performing a post develop bake of the first patterned layer of photoresist, as set forth in block 208; etching the first pattern into the trench hard mask layer, as set forth in block 209; removing the photoresist having the first pattern, as set forth in block 210; depositing another layer of photoresist over the trench hard mask layer having the first pattern, as set forth in block 211; exposing the photoresist with a second pattern of polarized light, as set forth in block 212; performing a post-exposure bake of the photoresist, and then develop the exposed photoresist, forming the second pattern into the photoresist, as set forth in block 213; applying a shrink coating over the patterned photoresist, baking the shrink coating and photoresist, as set forth in block 214, so that the shrink coating may contract, pulling the photoresist into the trenches of the patterned photoresist, thus reducing the sizes of the trenches patterned in the photoresist, and rinsing the shrink coating from the patterned photoresist; measuring the CD and/or LER of the trenches formed in the photoresist, as set forth in block 216; repeating the application of the shrink coating, if necessary, as set forth in block 214; performing a post develop bake of the second patterned layer of photoresist, as set forth in block 218; etching the second pattern into the trench hard mask layer, as set forth in block 219; removing the photoresist having the second pattern, as set forth in block 220; and etching the bottom layer under the trench hard mask layer having both the first and second patterns, as set forth in block 221.

Embodiments, illustrated in FIGS. 3A to 3G illustrate cross-sectional views of processing a substrate with embodiments of a double exposure lithographic process for reducing line edge roughness (LER), increasing resolution, reducing the critical dimension (CD) and pitch capabilities of lithographic processes. A double exposure lithographic process or a double patterning method may comprise forming a fully patterned structure, such as an interconnect structure, by patterning with two or more masks having relaxed pitches between alternating interconnect structures onto a hard mask layer, wherein the interconnect structures on each mask are different and offset in position from the interconnect structures on the other masks, and wherein the patterning with the two or more masks comprises aligning the offsetting masks so that the interconnect structures formed from a subsequent mask are positioned in the regions between the interconnect structures formed from a preceding mask. The interconnect structures produced by the two or more masks, each having relaxed pitches, are combined together on the hard mask layer to produce a fully patterned interconnect structure on the hard mask, wherein the resulting pitch of the fully patterned interconnect structure is very tight.

Figure 3A:
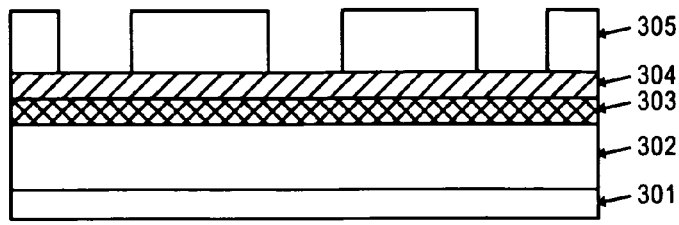
FIGS. 3A to 3G illustrate cross-sectional views of processing a substrate with embodiments of a double exposure lithographic process for reducing line edge roughness (LER), increasing resolution, reducing the critical dimension (CD) and pitch capabilities of lithographic processes.

Embodiments of FIG. 3A relate to the exposure and development of a first pattern. In embodiments, a first layer of photoresist is blanket deposited over a bottom anti-reflective coating (BARC) 304, which is over a hard mask layer 303, such as TiN, which is over a bottom layer 302, such as a dielectric, which is over a top layer of a substrate 301, which may be a metal layer or a device contact. Embodiments may provide the omission of the BARC layer 304. The first blanket layer of photoresist is exposed with patterned polarized light, post-exposed baked, and developed to form a first patterned photoresist layer 305.

Figure 4A:
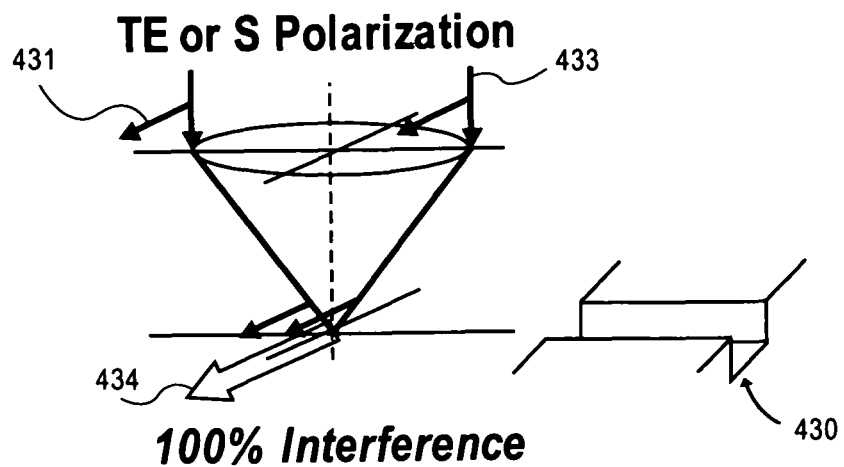
FIGS. 4A to 4B illustrate embodiments of polarization lithography related to patterning trench lines.
Figure 4B:
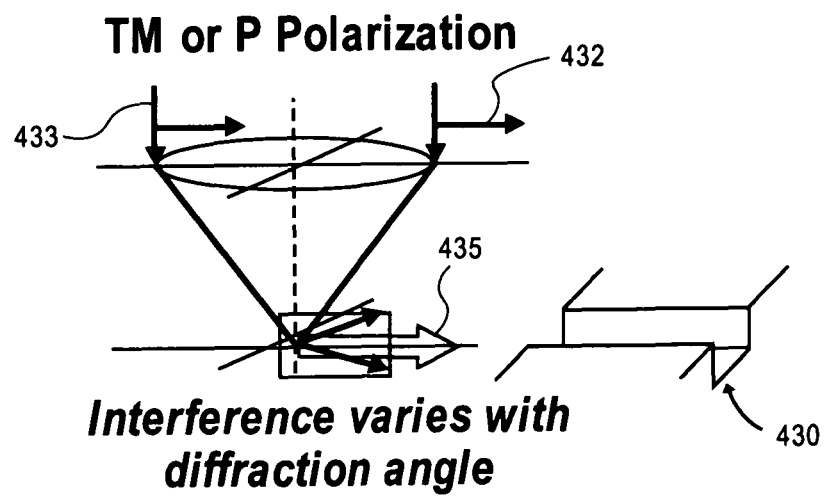

Referring to FIGS. 4A and 4B, incident light 433 is generally composed of a combination of transverse electric (TE) fields 431 and transverse magnetic (TM) fields 432. The magnitude and intensity of the TE fields 434, which may be approximately perpendicular to the orientation of the desired trench structure to be formed in the photoresist 430, are attenuated by the polarizer. Meanwhile the TM fields 435, which may be approximately parallel to the orientation of the desired trench structure to be formed in the photoresist 430, are transmitted through the polarizer, which may result in improved resolution of the trench pattern formed in the photoresist 430. In embodiments, the incident light 433 has a wavelength of approximately 193 nm. Embodiments comprise a reticle having a polarizer on one side of the reticle and a pattern on the other side of the reticle, wherein light incident to the reticle becomes polarized, and then the polarized light becomes masked into a pattern by the other side of the reticle, which exposes the photoresist layer with a pattern of polarized light.

Figure 3B:
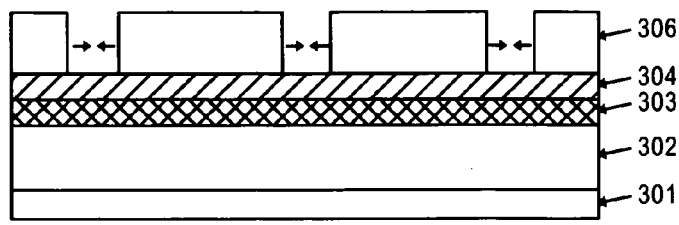

Embodiments, illustrated in FIG. 3B, relate to the application of the first shrink coating layer to the first patterned photoresist layer 305. In embodiments, the shrink coating and the first patterned photoresist layer 305 are baked so that the shrink coating contracts and the photoresist 305 begins to reflow, thus the shrink coating pulls the walls of the photoresist trench into the trench, thus narrowing the trench, and forming a first shrunk patterned photoresist layer 306. In embodiments, the bake temperature is approximately the photoresist glass transition temperature+/−30° C. Embodiments include the shrink coating material designated as SAFIER, distributed by Tokyo Ohka Kogyo Co., Ltd. Other embodiments include the shrink coating designated as RELACS, distributed by Clariant International, Ltd., Muttenz, Switzerland. After the trenches in the photoresist have been narrowed, the coating material may be removed with DI water, which may include a surfactant and/or isopropyl alcohol.

Figure 3C:
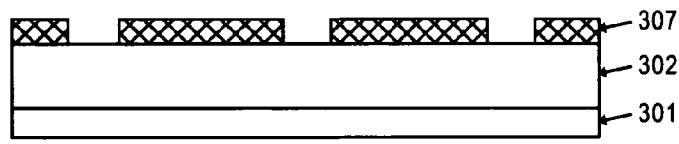

Embodiments, illustrated in FIG. 3C, relate to the etching of the pattern of the first shrunk patterned photoresist layer 306 into the hard mask layer 303. In embodiments, the first shrunk patterned photoresist layer 306 permits the etching of the first shrunk pattern into the hard mask layer 303 to form a first pattern hard mask layer 307. After forming the first patterned hard mask layer 307 the first shrunk patterned photoresist layer 306 and the remaining parts of the first BARC layer are removed.

Figure 3D:
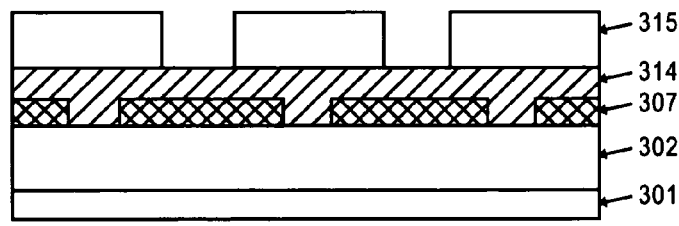

Embodiments, illustrated in FIG. 3D, relate to the exposure and development of the second pattern. In some embodiments, the second layer of a BARC layer 314 may be deposited over the first patterned hard mask layer 307. Embodiments provide a second blanket layer of photoresist deposited over the second BARC layer 314, or over the first patterned hard mask layer 307, if the embodiment does not include a second BARC layer 314. The second blanket layer of photoresist is exposed with patterned polarized light, post-exposed baked, and developed to form a second patterned photoresist layer 315.

Figure 3E:
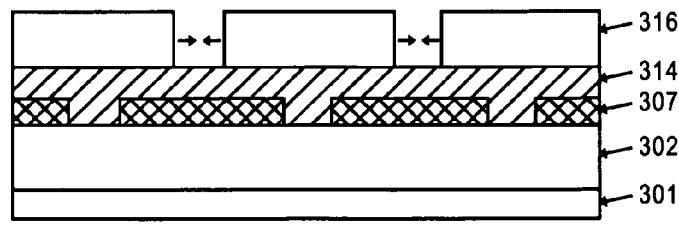

Embodiments, illustrated in FIG. 3E, relate to the application of the second shrink coating layer to the second patterned photoresist layer 315. In embodiments, the shrink coating and the second patterned photoresist layer 315 are baked so that the shrink coating contracts, the second patterned photoresist layer 315 begins to reflow, thus the shrink coating pulls the walls of the photoresist trench closer together, thus forming a second shrunk patterned photoresist layer 316, having narrower trenches and reduced CDs for the trench structures. Further, the shrink coating process may be effective in reducing LER.

Figure 3F:
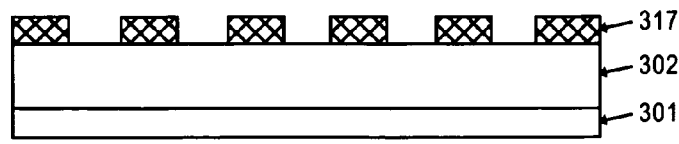

Embodiments, illustrated in FIG. 3F, relate to the etching of the second pattern into the first patterned hard mask layer 307. In embodiments, the second shrunk pattern photoresist layer 316 may be used to etch the second pattern into the first patterned hard mask layer 307 to form a first and second patterned hard mask layer 317. Embodiments further include the removal of the second shrunk patterned photoresist 316 and the remaining sections of the second BARC layer 314.

Figure 3G:
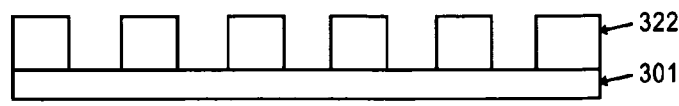

Embodiments, illustrated in FIG. 3G, relate to using the first and second patterned hard mask layer 317 to etch the first and second patterns into the bottom layer 302 to form the first and second patterned bottom layer 322. Embodiments of the double exposure process provides the capability of the first and second patterned bottom layer 322 having a smaller pitch, than neither the pitch of the first shrunk patterned photoresist 306 nor the pitch of the second shrunk patterned photoresist 316.

Embodiments using the combination of polarized light lithography, shrink coating processes, and double exposure processes may produce synergetic effects in the formation of trench structures, particularly in integrated circuit fabrication. Polarized light lithography provides good resolution, but is not very effective in reducing LER. Shrink coating processes are effective in reducing CDs in trenches and reducing LER, but are not useful in improving resolution. Neither, polarized light lithography, nor shrink coating provide much improvement in reducing the pitch of the trench structures. The double exposure processes provides an improvement in reducing the pitch of the trenches. However, the combination of double exposure, polarized lithography, and shrink coating processes provides better than expected improvement in pitch reduction, resolution, LER, and reduced CDs.

We claim:
1. A method of patterning a structure comprising:
   above a layer on a substrate;
   exposing the photoresist layer with a pattern of polarized light;
   performing a post-exposure bake on the exposed photoresist layer;

developing the photoresist layer to form a pattern photoresist layer;

applying a shrink coating over the patterned photoresist;

baking the shrink coating to form a reduced spacing patterned photoresist layer;

rinsing the shrink coating from the reduced spacing patterned photoresist layer;

after rinsing said shrink coating from the reduced spacing patterned photoresist layer, measuring a critical dimension (CD) of the reduced spacing patterned photoresist layer, and if no further reduction in spacing is to be performed, performing a post develop bake of the reduced spacing patterned photoresist layer; and after preforming said post develop bake etching said layer in alignment with said reduced spacing patterned photoresist layer.

2. The method of claim 1, wherein the structure comprises a plurality of lines and/or trenches, having an orientation, and wherein the pattern of polarized light further comprises predominately transverse magnetic (TM) fields, which are approximately parallel to the orientation of the plurality of lines and/or trenches; and attenuated transverse electric (TE) fields, which are approximately perpendicular to the orientation of the plurality of lines and/or trenches.

3. The method of claim 2, wherein the pattern of polarized light is formed from a reticle having a polarizer on one side of the reticle and a pattern on the opposite side of the reticle, wherein incident light is first polarized and then patterned by the reticle.

4. The method of claim 1, further comprising performing a second application of shrink coating, a second baking, and a second rinsing.

5. The method of claim 4, further comprising measuring the line edge roughness (LER) of said patterned photoresist layer after rinsing said shrink coating from the patterned photoresist layer and prior to the second application of the shrink coating.

6. The method of claim 1, wherein the shrink coating comprises a material that when baked at a bake temperature, contracts pulling the walls of a patterned photoresist layer into trenches formed in the patterned photoresist layer, so as to narrow the trenches.

7. The method of claim 6, wherein the bake temperature is at approximately the photoresist glass transition temperature+/−30° C.

8. The method of claim 6, wherein in the rinsing of the shrink coating after baking, the baked shrink coat material is removed with a rinsing fluid comprising a fluid selected from the group consisting of: de-ionized (DI) water, DI water with a surfactant, DI water with isopropyl alcohol, and any combination thereof.

9. A double exposure lithographic method comprising:

depositing a first layer of photoresist over a hard mask layer over a bottom layer on a substrate;

exposing the first photoresist layer with a first pattern;

performing a first post-exposure bake and first develop of the exposed first photoresist layer to form a first patterned photoresist;

applying a first shrink coating over the first patterned photoresist;

baking the first shrink coating and first patterned photoresist, wherein the first shrink coating contracts, pulling the photoresist into the trenches of the first patterned photoresist, thus reducing the sizes of the trenches patterned in the first patterned photoresist;

rinsing the first shrink coating from the first patterned photoresist;

after rinsing the first shrink coating from the first patterned photoresist, measuring a critical dimension (CD) of the first patterned photoresist layer, and if no further reduction in spacing is to be performed, performing a first post develop bake of the first patterned photoresist;

transferring the first pattern into the hard mask layer, to form a first patterned hard mask layer;

removing the first patterned photoresist;

depositing a second layer of photoresist over the first patterned hard mask layer;

exposing the second photoresist layer with a second pattern;

performing a second post-exposure bake of the second photoresist layer;

developing the exposed second photoresist layer to form a second patterned photoresist layer;

applying a second shrink coating over the second patterned photoresist layer, baking the second shrink coating and second patterned photoresist, so that the second shrink coating may contract, pulling the photoresist into the trenches of the second patterned photoresist, thus reducing the sizes of the trenches in the second patterned photoresist layer;

rinsing the second shrink coating from the second patterned photoresist layer;

performing a second post develop bake of the second patterned photoresist layer;

transferring the second pattern into the first patterned hard mask layer to form a fully patterned hard mask layer, wherein the fully patterned hard mask layer comprises a combination of the first and second patterns, each have alternating structures, with relaxed pitches, which are different and offset from each other, so that the combination of the first and second patterns results in a fully patterned structure, with tighter pitches;

removing the second patterned photoresist layer; and etching the fully patterned structure in the fully patterned hard mask layer into the bottom layer underlying the fully patterned hard mask layer.

10. The method of claim 9, further comprising a first bottom anti-reflective coating (BARC) over the hard mask layer and underlying the first photoresist layer.

11. The method of claim 10, further comprises depositing a second bottom anti-reflective coating (BARC) over the first patterned hard mask layer and prior to depositing the second photoresist layer.

12. The method of claim 11, wherein the transferring of the first and second patterns into the hard mask layer further comprises etching the first and second BARC layer with the respective first and second patterns.

13. The method of claim 9, wherein the hard mask layer comprises TiN.

14. The method of claim 9, wherein the fully patterned structure comprises an interconnect structure, and wherein the bottom layer comprises a dielectric material.

15. The method of claim 9, wherein the fully patterned structure comprises a plurality of lines and/or trenches, having an orientation, and wherein the exposing of the first and second photoresist layers with the first and second patterns, each having a plurality of lines and/or trenches, comprises exposing with polarized light, which comprises predominately transverse magnetic (TM) fields, which are approximately parallel to the orientation of the plurality of lines and/or trenches; and attenuated transverse electric (TE) fields, which are approximately perpendicular to the orientation of the plurality of lines and/or trenches.

16. The method of claim 15, further comprising measuring the LER of the plurality of lines and/or trenches formed in the first and/or second patterned photoresist.

17. The method of claim 16, further comprising repeating the application of the first and/or second shrink coatings.

18. The method of claim 9, wherein the first and second shrink coatings comprise a material that when baked at a bake temperature, contracts pulling the walls of the first and second patterned photoresist layers into trenches formed in the first and second patterned photoresist layers, so as to narrow the trenches.

19. The method of claim 18, wherein the bake temperature is at approximately the photoresist glass transition temperature+/−30° C.

20. The method of claim 18, wherein in the rinsing of the first and/or second shrink coatings after baking, the first and/or second baked shrink coat material is removed with a rinsing fluid comprising a fluid selected from the group consisting of:
de-ionized (DI) water, DI water with a surfactant, DI water with isopropyl alcohol, and any combination thereof.

* * * * *

UNITED STATES PATENT AND TRADEMARK OFFICE
CERTIFICATE OF CORRECTION

PATENT NO. : 8,501,395 B2  
APPLICATION NO. : 12/156770  
DATED : August 6, 2013  
INVENTOR(S) : Huixiong Dai et al.

Page 1 of 1

It is certified that error appears in the above-identified patent and that said Letters Patent is hereby corrected as shown below:

IN THE CLAIMS

Col. 6, line 63 before "above" please insert --forming a photoresist layer--

Signed and Sealed this  
Thirty-first Day of December, 2013

Margaret A. Focarino  
*Commissioner for Patents of the United States Patent and Trademark Office*